United States Patent [19]
Butler et al.

[11] 4,070,666
[45] Jan. 24, 1978

[54] AUTOMATIC POLARITY SENSING ANALOG-TO-DIGITAL CONVERTER

[75] Inventors: Walter J. Butler, Scotia; Charles W. Eichelberger, Schenectady, both of N.Y.

[73] Assignee: General Electric Co., Schenectady, N.Y.

[21] Appl. No.: 698,012

[22] Filed: June 21, 1976

[51] Int. Cl.² ............................................. H03K 13/02
[52] U.S. Cl. ....................... 340/347 AD; 340/347 NT
[58] Field of Search ....... 340/347 M, 347 C, 347 AD, 340/347 NT

[56] References Cited

U.S. PATENT DOCUMENTS

| | | |
|---|---|---|
| 2,801,281 | 7/1957 | Oliver .......................... 340/347 AD |
| 2,824,285 | 2/1958 | Hunt ............................. 340/347 AD |
| 3,216,002 | 11/1965 | Hoffman ....................... 340/347 C |
| 3,414,807 | 12/1968 | Evans ............................ 340/347 NT |
| 3,942,174 | 3/1976 | Dorey .......................... 340/347 AD |
| 3,943,506 | 3/1976 | Peattie ......................... 340/347 AD |

Primary Examiner—Charles D. Miller
Attorney, Agent, or Firm—Geoffrey H. Krauss; Joseph T. Cohen; Jerome C. Squillaro

[57] ABSTRACT

An analog-to-digital converter of the metered charge transfer type is provided including an automatic polarity sensing circuit which selectively connects first and second input terminals to a charge storage location at appropriate times during a measurement cycle in order to insure that proper polarity relationships are maintained.

11 Claims, 12 Drawing Figures

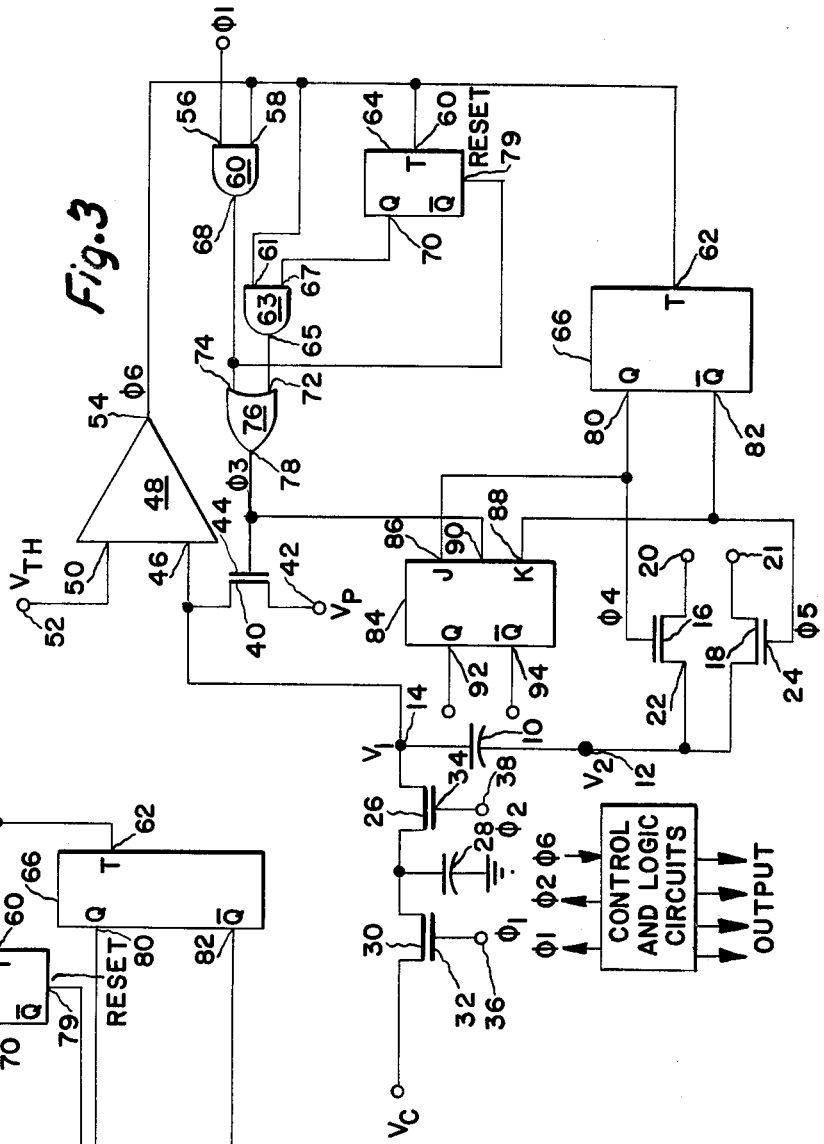
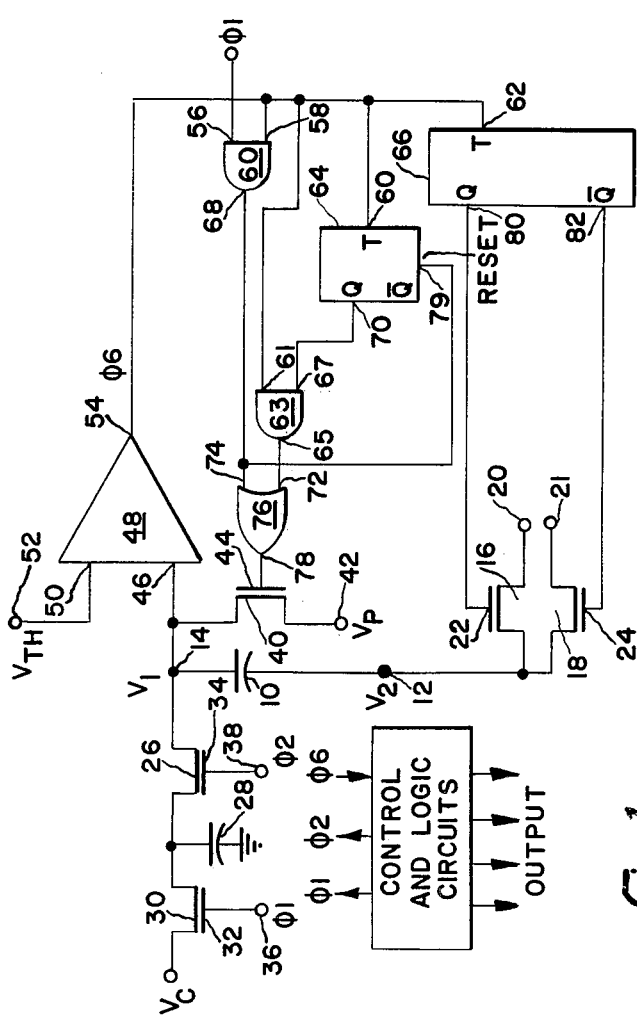

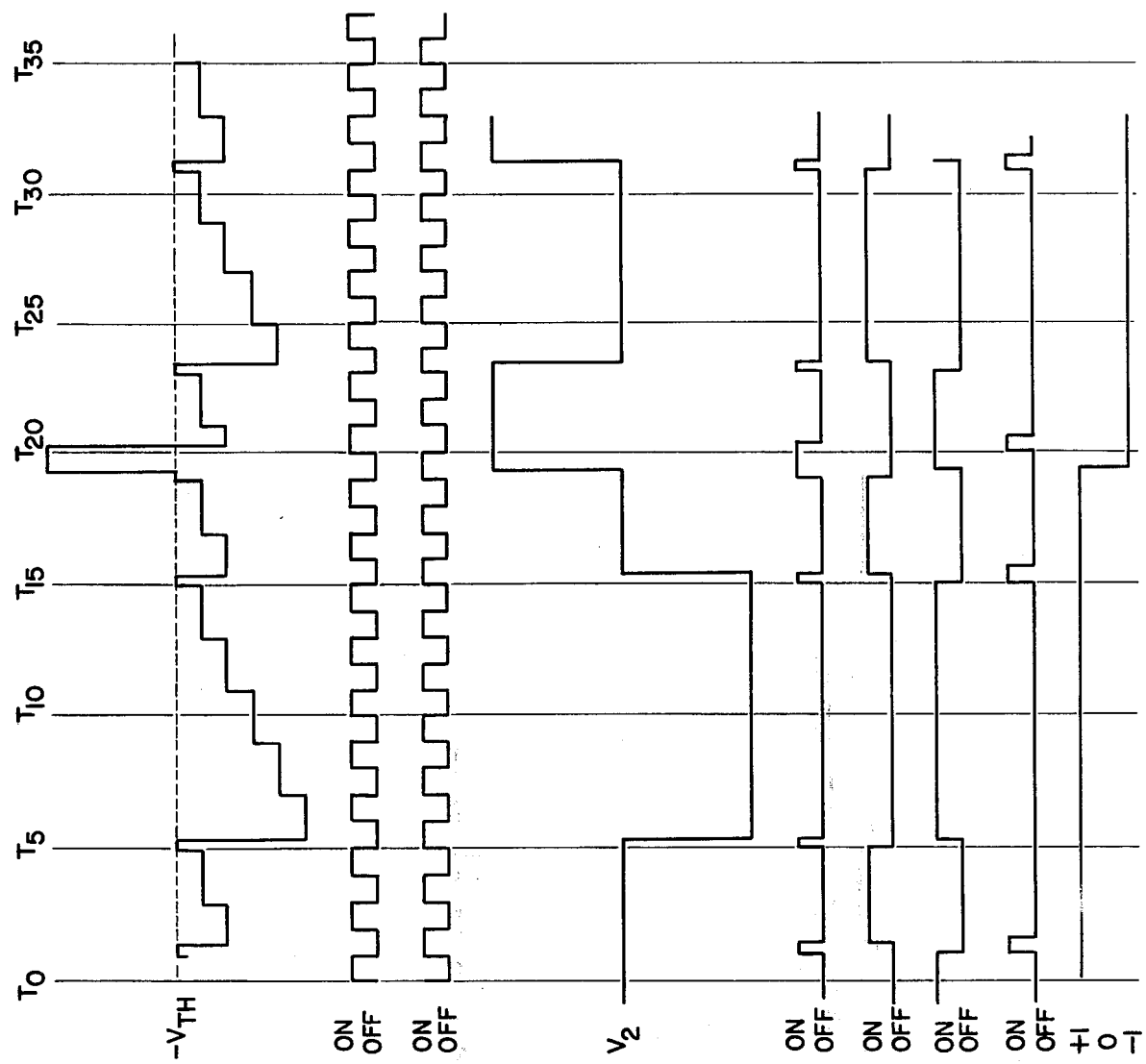

AUTOMATIC POLARITY SENSING ANALOG-TO-DIGITAL CONVERTER

This invention relates, in general, to charge transfer analog-to-digital converters and more specifically to a charge transfer analog-to-digital converter for automatically measuring signals of any polarity.

Charge transfer analog-to-digital converters of the type with which this invention is concerned are described, for example, in U.S. Pat. application Ser. No. 689,456, filed May 24, 1976, for ANALOG-TO-DIGITAL CONVERTER by W. J. Butler et al; and U.S. Pat. application Ser. No. 628,401, filed Nov. 3, 1975 for ANALOG-TO-DIGITAL CONVERTER by C. W. Eichelberger, both of which U.S. patent applications are assigned to the same assignee as the instant application. The foregoing U.S. patent applications describe a new and improved type of analog-to-digital converter having many advantages over the prior art types. The analog-to-digital converters described in the above-referenced applications are adapted to convert only unipolarity input signals without the need for external circuitry to correctly apply the signals to the analog-to-digital converters. It is, of course, desirable in some cases to provide an analog-to-digital converter which automatically senses the polarity of the applied input signal and provides an output which is indicative both of the magnitude and polarity thereof. In order to accomplish this bipolar operation, it has been the practice in accordance with certain prior art devices to establish an artificial reference point in the approximate center of the range of the analog-to-digital converter and measure input voltages with respect to this point thus achieving an artificial zero. This clearly reduces the capabilities of the device insofar as the maximum magnitude of voltage measurable and the resolution thereof. It is desirable, therefore, to provide for automatic polarity sensing without the need for reducing, in any way, the desirable characteristics of the converter to which automatic polarity sensing is applied.

It is an object, therefore, of this invention to provide apparatus for automatically accommodating either positive or negative polarity input signals in an analog-to-digital converter of the metered charge transfer type.

It is another object of this invention to provide an automatic polarity sensing capability in an analog-to-digital converter without sacrificing any of the resolution of a unipolar device.

It is still another object of this invention to provide a bipolar analog-to-digital converter of the metered charge transfer type which is readily adapted to be fabricated in accordance with metal-oxide-semiconductor (MOS) technology so that an analog-to-digital converter of the type to which this invention relates and especially a converter of the type described in the above-mentioned U.S. patent applications may be fabricated as a single integrated circuit device.

Briefly stated, and in accordance with one aspect of this invention, an analog-to-digital converter is provided having the capability for measuring both positive and negative differential input signals. A measurement cycle includes two periods which together comprise a complete cycle, i.e., a first "zero" period and a second "measurement" period. First and second inputs are provided which are selectively connected to a charge storage location which, in a preferred embodiment of this invention, is a capacitive charge storage location; one of said first and second input terminals being connected to said charge storage location during each of said zero and measurement periods. In accordance with a presently preferred embodiment of this invention, the level of charge in the charge storage location is continuously measured by a threshold detector which provides an output signal when said level of charge exceeds a preselected level. During a zero portion of a measurement cycle, charge is added to a first terminal of the charge storage location while the second terminal is connected to one of the differential input terminals. At the end of the zero period when the threshold detector indicates by the production of an output signal thereat that the threshold charge level has been reached, the second terminal of said charge storage location is switched to the opposite input terminal and, if the polarity relationships at said first and second input terminals are correct, the voltage at the input to the threshold detector decreases below the threshold value and the output signal is removed. Whenever the polarity relationship at the input terminals is incorrect, the voltage to the threshold detector will increase rather than decrease and the output signal provided by threshold detector will not be removed when the threshold level is reached and the input terminals are switched such that the formerly connectd by terminal becomes disconnected and the disconnected terminal becomes connected switching means responsive to the continuation of the threshold detector output signal beyond the switching of the input signals. The switching means are operative to change what would normally have been the start of a measurement portion of the cycle to a zero portion and accordingly to provide a precharge signal to the charge storage location. Thereafter, so long as the input voltage applied to the analog-to-digital converter does not again change in polarity, those periods which would otherwise have been zero periods are subsequently measurement periods and vice versa. These conditions are maintained until such time as the coincidence of an output signal from the threshold detector and the beginning of a measurement period occur thereby indicating an inverse application of signal voltage to the inputs of the analog-to-digital converter at which time the zero and measurement periods are again interchanged.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a partial schematic, partial block diagram of a circuit in accordance with this invention for providing automatic bipolar operation in a charge transfer analog-to-digital converter.

FIGS. 2a through 2i are waveform diagrams of certain of the signals appearing in the circuit of FIG. 1.

FIG. 3 is a partial schematic diagram of a circuit in accordance with this invention providing output signals indicative of the polarity of the input signal applied to the converter.

Figure 4:
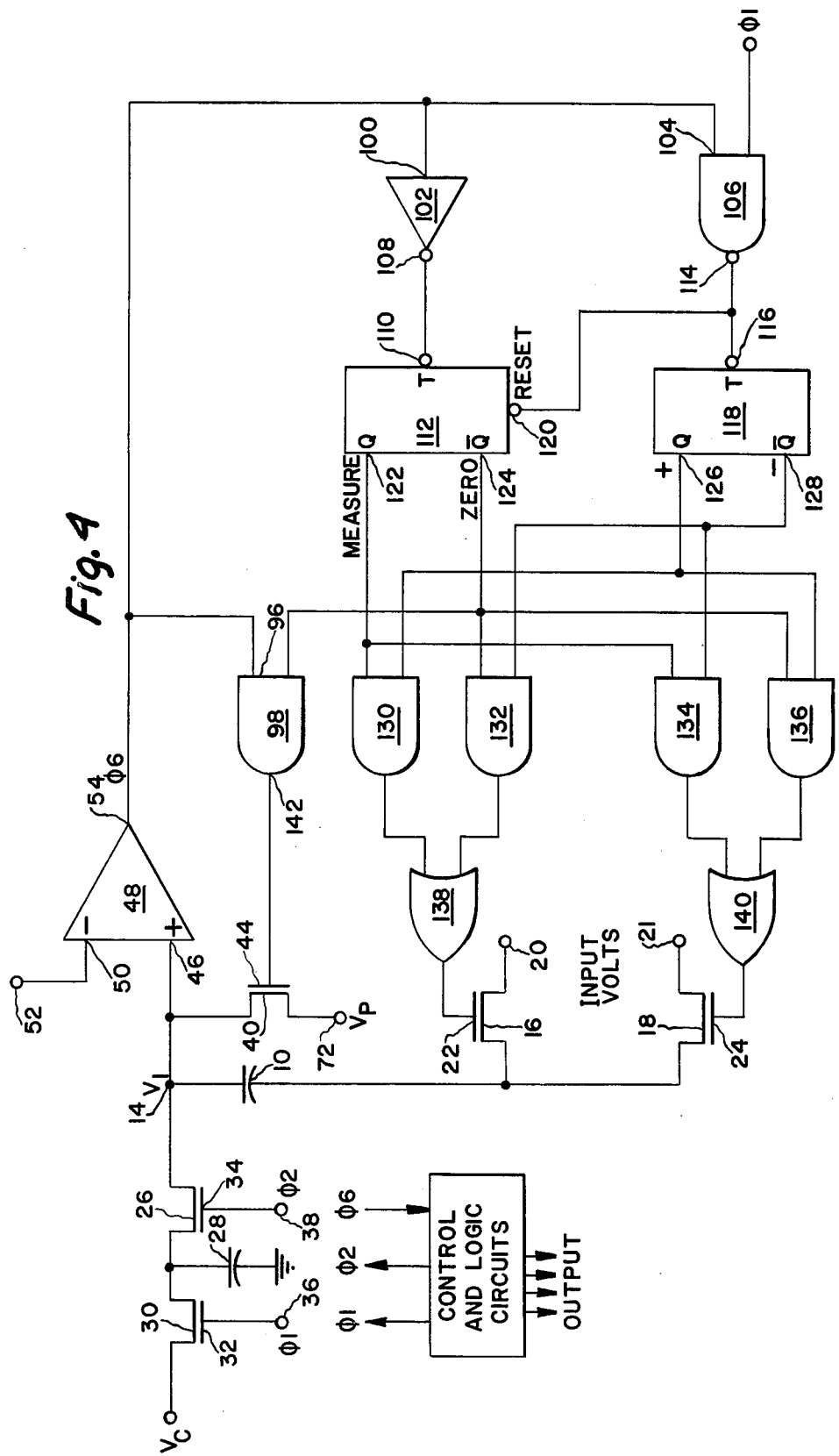
FIG. 4 is a partial schematic diagram of another embodiment of this invention.

Referring now to FIG. 1, it will be appreciated that only that portion of a charge transfer analog-to-digital converter of the type described in the U.S. patent application hereinabove referenced which is necessary to understand the operation of the instant invention is illustrated. Specifically, a first capacitive charge storage location 10 which may conveniently be a capacitor of the MOS type in an integrated circuit embodiment of this invention, having first and second terminals 12 and 14, the voltages appearing at which are designated $V_2$ and $V_1$, respectively. Terminal 12 is connected through semiconductor switches 16 and 18 to first and second input terminals 20 and 21, respectively. Switches 16 and 18 are preferably semiconductor switches which are selectively energized by the application of appropriate triggering signals to gates 22 and 24. Terminal 14 of capacitive charge storage location 10 is connected through semiconductor switch 26 to capacitor 28. Capacitor 28 is further connected to voltage source $V_c$ through semiconductor switch 30. Switches 26 and 30 are selectively energized by the application of signals $\phi 1$ and $\phi 2$ to gate electrodes 32 and 34 from terminals 36 and 38, respectively. Terminal 14 of charge storage location 10 is also connected, through semiconductor switch 40 to terminal 42 which is adapted to be connected to a source of precharge voltage $V_p$. Semiconductor switch 40 is energized by the application of a signal to gate electrode 44 thereof. Terminal 14 of capacitive charge storage location 10 is further connected to input 46 of threshold detector 48, terminal 50 of which is connected to threshold voltage source $V_{th}$ at terminal 52. Threshold detector 48 is responsive to a signal applied to input 46 thereof to provide an output at output terminal 54 whenever the signal applied to input 46 exceeds that applied to input 50. It will be appreciated by those skilled in the art that $V_{th}$ may, in fact, not be an actual voltage source but is intended, as used herein, to indicate the threshold voltage of comparator 48. The output signal produced by comparator 48 when the signal applied to input 46 exceeds that applied to input 50 is designated $\phi 6$.

The operation of that portion of the analog-to-digital converter in accordance with this invention so far described is substantially identical to that described in the foregoing U.S. patent application. Briefly, the conversion of an analog signal to a digital equivalent thereof, commences with the activation of one of semiconductor switches 16 or 18 thereby connecting, for example, the input signal applied to terminal 21 to terminal 12 of capacitive charge storage location 10. Charge packets are then transferred to capacitive charge storage location 10 by the alternate energizing of gate terminals 32 and 34 by control signals $\phi 1$ and $\phi 2$ which are illustrated, for example, at FIGS. 2b and 2c. The size of the charge packets transferred is controlled by the relative size of capacitors 10 and 28 and the magnitude of voltage $V_c$. As charge is transferred, the voltage appearing at terminal 14 which is designated $V_1$ increases towards the threshold voltage of detector 48 until the threshold voltage is exceeded, at which point $\phi 6$ changes state from "off" to "on." As $\phi 6$ changes state, control means (not illustrated) simultaneously change the states of transistor switches 16 and 18 so that switch 18 opens while switch 16 closes and initiates a measurement portion of a conversion cycle. During this portion the number of charge packets transferred to capacitive charge storage location 10 is counted, the number of counts required to once again reach the threshold level of comparator 48 being directly proportional to the difference between the voltages applied to terminals 20 and 21. At the end of the measurement portion of the cycle $\phi 6$ again changes state from "off" to "on," having been switched from "on" to "off" when measurement portion of the cycle began. Still further, the end of the measurement portion of the conversion cycle activates the control means to apply a signal to terminal 44 of semiconductor switch 40 to connect voltage $V_p$ to terminal $V_1$ to set the initial voltage at terminal 14 capacitive charge storage location 10 below the threshold voltage of comparator 48. This is required to insure that during the first or zero portion of the measurement cycle voltage $V_1$ will not exceed the threshold voltage of the comparator until a finite number of charge transfers have occurred.

It will be appreciated that the conversion operation just described requires that the voltages applied to terminals 20 and 21 be in a particular polarity relationship with each other and specifically that the voltage applied to terminal 20 be more negative than that applied to terminal 21 so that when a measurement portion of a conversion cycle begins by the removal of voltage 21 from terminal 12 and the application of voltage 20 thereto, that voltage $V_1$ will decrease below the threshold voltage of comparator 48 rather than increase above it. In accordance with this invention, means are provided for automatically assuring that the proper polarity relationship is maintained so that signals may be appled to input terminals 20 and 21 without the need for concern over which terminal receives the more positive voltage. Consequently, the measurement range of an analog-to-digital converter in accordance with this invention is twice that of a prior art converter since both positive and negative voltages may be measured without the need for any change in connection between the unknown voltage source and terminals 20 and 21.

By referring now to FIG. 1 and to FIGS. 2a–2i, the operation of the automatic polarity circuit in accordance with this invention may readily be understood. $\phi 6$ and $\phi 1$ which are the output of comparator 48 and the clock signal illustrated at FIG. 2b, respectively, are connected to inputs 58 and 56 of AND gate 60, respectively. $\phi 6$ is further connected to inputs 60 and 62 of flip-flops 64 and 66 and to input 61 of AND gate 63. Flip-flops 64 and 65 are of the J–K type wherein outputs Q and $\overline{Q}$ are alternately energized in response to input T. Output 68 of AND gate 60 and output 65 of AND gate 63 are connected to inputs 74 and 72 of OR gate 76. Output 70 of flip-flop 64 is connected to input 67 of AND gate 63. Output 78 of gate 76 is connected to gate electrode 44 of transistor switch 40. Output 68 of AND gate 60 is further connected to reset input 79 of flip-flop 64. Outputs Q and $\overline{Q}$ of flip-flop 66 are connected to gate electrodes 22 and 24 of semiconductor switches 16 and 18, respectivly. FIG. 2i is a graphical representation of the voltage applied to input terminal 20 with respect to terminal 21. From time $T_0$ to just after time $T_{19}$, which time periods are arbitrarily selected, the voltage applied to terminal 20 is positive with respect to that applied to 21. From just after time 19 to time 35, the voltage is opposite in polarity, that is to say negative. It is emphasized that in accordance with this invention, the designation of positive and negative voltage is to some extent arbitrary and the polarity which will be considered positive or negative is dependent upon the characteristics of the analog-to-digital converter concerned. In the case of p-channel devices which are presumed herein, the voltage applied to terminals 20 and 21 during the period from time $T_0$ to just after time $T_{19}$ is of a polarity such that terminal 20 is more positive than terminal 21. Similarly, during the period from just after $T_{19}$ until after time $T_{35}$, the voltage applied to terminal 20 is more negative than the voltage applied to terminal 21. This may be readily seen by reference to FIG. 2i.

Referring now to FIG. 2a wherein the voltage at terminal 14 of capacitive charge storage location 10 is graphically illustrated, it may be appreciated that a conversion cycle in accordance with this invention includes two portions, a zero portion which extends from time $T_1$ to just after time $T_5$ and a measurement portion which extends from just after time $T_5$ to time $T_{15}$. At time $T_1$, $\phi 6$ is ON during the period that $V_1$ exceeds or is equal to $V_{th}$. Flip-flop 64 provides a signal at output 70 thereof every other time that $\phi 6$ is ON. The signal at output 70 of flip-flop 64 is applied to AND gate 63 along with $\phi 6$ and output 65 provides a signal whenever both output 70 and $\phi 6$ are present. Output 65 is connected to OR gate 76 which provides an output signal $\phi 3$ at output 78 which is illustrated in FIG. 2h. Transistor switch 40 is turned on and voltage source $V_p$ is connected to terminal 14 of capacitive charge storage location 10 thus causing $V_1$ to decrease just after time $T_1$. When $V_1$ decreases below $V_{th}$, $\phi 6$ turns off and the signal applied to gate electrode 44 of transistor switch 40 is removed. Charge is now transferred by the alternate cycling of $\phi 1$ and $\phi 2$ as described until the threshold voltage level is again reached at time $T_5$. Comparator 48 again provides output $\phi 6$ which toggles flip-flop 64 to the OFF state in which Q is zero and $\overline{Q}$ is high. No signal is applied to gate electrode 44 of transistor switch 40. The states of transistor switches 16 and 18 are changed by flip-flop 66. Each time a pulse is produced at the output 54 of comparator 48, flip-flop 66 changes state. During the time from $T_1$ to $T_5$, Q output 80 is high while $\overline{Q}$ output 82 is low thus turning transistor switch 16 ON and switch 18 OFF. Just after time $T_5$, switch 18 is turned ON and switch 16 OFF thus connecting the more negative voltage to terminal 12. The change in voltage $V_1$ which occurs just after time $T_5$ is determined by the difference between the voltages applied to terminals 20 and 21. The number of charge transfers occurring between time $T_5$ and time $T_{15}$ provides a measure of the magnitude of the voltage difference. At time $T_{15}$ an output signal is again produced at $\phi 6$ which toggles flip-flop 66 and reverses its Q and $\overline{Q}$ outputs, thus turning transistor switch 16 ON and switch 18 OFF. At the same time, flip-flop 64 is again toggled turning output 70 high to again provide a signal to gate electrode 44 of transistor switch 40 to discharge capacitive charge storage location 10. At time $T_{19}$ at the end of the second zero period, the threshold is again reached, $\phi 6$ again turns ON and after a slight delay outputs 80 and 82 of flip-flop 66 again reverse turning transistor switch 16 OFF and 18 ON.

Referring now to FIG. 2i, it will be noted that at this same time, just after time $T_{19}$, the input voltage is abruptly changed such that the polarity between terminals 20 and 21 is reversed. When transistor switch 16 is turned ON, the voltage at node 14 rather than decreasing below the threshold voltage increases and $\phi 6$ remains ON. At time $T_{20}$, $\phi 1$ and $\phi 6$ are both ON thus providing an ON signal at output 68 of AND gate 60 which supplies an ON signal to electrode 44 of transistor switch 40 to connect $V_p$ to terminal 14. This causes $V_1$ to fall to voltage $V_p$ turning $\phi 6$ off. The ON signal appearing at output 68 of AND gate 60 also resets flip-flop 64 and instead of beginning a second measurement period, a zero period is commenced. At time $T_{23}$, the threshold voltage is again reached, $\phi 6$ turns ON and flip-flops 64 and 66 are toggled. Transistor switch 16 turns ON while switch 18 turns OFF and since, as indicated at FIG. 2, the voltage applied to terminal 20 is lower than that applied to terminal 21, $V_1$ decreases by an amount determined by the difference in voltage supplied to terminals 20 and 21. At the time $V_1$ decreases $\phi 6$ turns OFF and the measurement portion of a cycle proceeds normally. At time $T_{31}$ the threshold voltage is again reached, the number of charge transfers occurring between time $T_{23}$ and $T_{30}$ being proportional to the magnitude of the voltage applied between terminals 20 and 21.

Basically, the circuit of FIG. 1 provides two functions. Transistor switches 16 and 18 are selectively energized, one at a time, in alternating fashion in order to provide consecutive zero, measure, and zero periods. A zero period requires that transistor switch 40 be turned ON in order to initialize $V_1$ at a value established by $V_p$. During a conversion cycle, the end of a zero period sees a reversal in the conduction states of transistor switches 16 and 18 so that the opposite of inputs 20 and 21 is connected to terminal 12 of capacitor charge storage location 10. It is required that the zero period occur when node 12 is connected to the more positive of the voltages applied to terminals 20 and 21 for p-channel devices, and therefore when a measurement period begins, that voltage $V_2$ decreases as a consequence of the switching action of switches 16 and 18. Accordingly, where $V_2$ and consequently $V_1$ increase at the end of a zero period as switches 16 and 18 change state, transistor switch 40 is energized and a new zero period rather than a measurement period begins. Subsequently, a measurement period is initiated at the end of the new zero period.

FIG. 3 illustrates an embodiment of this invention which includes a circuit for providing an indication of the polarity of the signal applied to to the analog-to-digital converter in accordance with this invention. Like numbered elements with the converter of FIG. 1 are designated by like reference numerals. FIG. 3 includes flip-flop 84 having first input 86 connected to output 80 of flip-flop 66 and second input 88 connected to output 82 of flip-flop 66. Inputs 86 and 88 are labeled J and K as is conventional and flip-flop 84 is to be understood to be a set-reset flip-flop including a clock input 90 connected to output 78 of OR gate 76. Outputs 92 and 94 which are the Q and $\overline{Q}$ outputs of the flip-flop, respectively, provide signals when the signal applied to inputs 20 and 21 of the converter are positive or negative with respect to the previously defined relationship. It may be appreciated by reference to FIG. 3 and FIG. 2 that flip-flop 84 is responsive to outputs 80 and 82 of flip-flop 66 whenever a signal appears at output 78 of OR gate 76. Referring now to FIG. 2 and especially to FIGS. 2f and 2h, it will be observed that time $T_1$ an ON signal is provided at output 78 simultaneously with an ON signal at output 80 of flip-flop 66 thus triggering flip-flop 84 to provide an ON signal at ouptut 92 thereof. A similar condition exists at time $T_{15}$. At time $T_{20}$, however, an ON signal is produced at output 78 simultaneously with an ON signal at output 82 of flip-flop 66 and flip-flop 84 is thus triggered to change state providing an ON signal at output 94 thereof and an OFF signal at output 92. It will be seen that this condition is repeated at time $T_{31}$. An ON signal at output 92 of flip-flop 84 thus represents what has been defined as a positive polarity applied signal while an on signal at $\overline{Q}$ output 94 of flip-flop 84 represents a negative polarity applied signal.

Those skilled in the art will appreciate that the particular limitations of this invention illustrated in FIGS. 1 and 3 are readily subject to modification and change in order to achieve the same function without departing from the true spirit and scope of this invention. FIG. 4 illustrates an alternative embodiment of the invention, wherein a somewhat different logical structure is utilized to obtain substantially identical results. Like numbered elements with FIGS. 1 and 3 are designated in FIG. 4 by like reference numerals. Output 54 of comparator 48 is connected to input 96 of AND gate 98 and also to input 100 of inverter 102 and input 104 of NAND gate 106. Output 108 of inverter 102 is connected to input 110 of flip-flop 112. Output 114 of NAND gate 106 is connected both to input 116 of flip-flop 118 and to reset input 120 of flip-flop 112. Flip-flops 112 and 118 are of the J-K type which provide outputs Q and $\overline{Q}$ alternately upon the application of signals to toggle inputs 110 and 116. Output 122 of flip-flop 112 is high during a measurement portion of a conversion cycle while output 124 is high during a zero portion. Similarly, output 126 of flip-flop 118 is high when a positive signal is applied to inputs 20 with respect to 21 while output 128 is high when a minus signal is so applied. AND gates 130, 132, 134 and 136 provide signals to gate electrodes 22 and 24 of semiconductor switches 16 and 18 to provide the signals illustrated in FIGS. 2f and 2g. OR gates 138 and 140 combine the outputs of AND gates 130 and 132; and 134 and 136, respectively. It will be appreciated that electrode 22 of semiconductor switch 16 will be energized whenever either a measurement and a plus or zero and a minus signal are received from flip-flops 112 and 118. Similarly, gate electrode 24 is energized whenever either a measure and a minus or a zero and a plus signal occur simultaneously at the appropriate outputs of flip-flop circuits 112 and 118. Output 142 of AND gate 98 energizes gate electrode 44 semiconductor switch 40 on the coincidence of an ON signal from output 54 of threshold detector 48 and a zero period as indicated by an output from output 124 of flip-flop 112.

While the invention has been particularly shown and described with reference to several preferred embodiments thereof, it will be understood by those skilled in the art that various changes in form and detail may be made therein without departing from the true spirit and socpe of the invention as defined by the appended claims.

What is claimed is:

1. In a time-independent charge transfer analog-to-digital converter of the type wherein a differential analog input signal is converted to a digital output signal by the substantially linear metered transfer of charge from first charge storage means during a time-independent two part conversion cycle including an initial ZERO period followed by a MEASUREMENT Period, said first charge storage means having first and second terminals, said converter including detector means connected to a first terminal of said charge storage means and responsive to a preselected threshold level of charge therein to produce an output signal whenever the level of charge in said charge storage means equals or exceeds said preselected level, the improvement for automatically measuring both positive and negative differential input signals, comprising:

first and second input terminals adapted to have said analog input signal connected therebetween:

controllable switch means for selectively connecting one and the other, respectively, of said first and second input terminals to said second terminal of said charge storage means respectively during said zero and measurement periods;

precharging means for establishing a predetermined initial charge level in said first charge storage means at the end of each of said measurement periiods and before each of said pero periods, said predetermined initial charge level being less than said preselected threshold level; and control means connected to said detector means for controlling said switch means to reverse the order of connection of said first and second input terminals to said charge storage means whenever said output signal is present during a measurement period;

said precharging means being enabled to cause said conversion cycle to be re-initialized with a zero period whenever said output signal is present during a measurement period, to cause the magnitude of the differential analog signal to be converted in a single conversion cycle regardless of the polarity of said analog signal.

2. The apparatus of claim 1 further comprising means responsive to said control means for triggering said precharging means to initiate a zero period whenever said output signal is present during a measurement period.

3. The apparatus of claim 1 wherein said controllable switch means comprises first electrical switch means connected to said charge storage means and to said first input terminal, second electrical switch means connected to said charge storage means and to said second input terminal and first flip-flop circuit means connected to said first and second electrical switch means for alternately connecting said charge storage to said first and second input terminals.

4. The apparatus of claim 3 further comprising polarity indicating means connected to said control means for providing an output signal indicative of the polarity of said analog input signal.

5. The apparatus of claim 4 wherein said polarity indicating means comprises second flip-flop circuit means.

6. The apparatus of claim 5 wherein said second flip-flop circuit means includes first and second inputs connected to said first flip-flop circuit means.

7. The apparatus of claim 1 wherein said precharging means comprises a precharge voltage source and controllable switch means for connecting said charge storage means to said precharge voltage source.

8. The apparatus of claim 7 further comprising means connected to said detector means responsive to said output signal therefrom and to said controllable switch means for activating said switch means to connect said charge storage means to said precharge voltage source once in response to every other output signal from said detector means, said detector means providing an output signal at the end of each measurement and each zero period.

9. The apparatus of claim 8 wherein said means responsive to said output signal comprises flip-flop circuit means including an input port and an output port, said output port operative to produce a signal every other time a signal is applied to said input port.

10. The apparatus of claim 9 wherein said flip-flop circuit means further includes a reset port connected to said control means for resetting said flip-flop circuit means whenever said output signal is present during said measurement period.

11. An automatic polarity sensing charge transfer analog-to-digital converter comprising:

first and second differential input terminals connectable to a source of analog input voltage;

first charge storage means having first and second terminals;

first and second controllable switch means for selectively connecting said first and second input terminals to said first terminal of said first charge stroage means during first and second periods respectively;

detector means connected to said second terminal of said charge means and reponsive to the voltage therein for providing an output signal whenever said voltage exceeds a preselected threshold level;

precharging means for establishing said voltage at a level less than said threshold level;

means for transferring a metered plurality of substantially equal sized charge packets from said first charge storage means in substantially time-independent manner;

measurement control means connected to said first and second controllable switch means, said detector means, said precharging means and said transferring means for energizing said precharging means at the beginning of said first period and for activating said first and second switch means to interchange the connection of said first and second input terminals to said charge storage means at the beginning of each of said first and said second periods;

automatic polarity control means connected to said measurement control means for reversing the connection of said first and second differential input terminals to said first terminal of said charge storage means during said first and second periods so that said second input terminal is connected to said charge storage area during said first period and said first terminal is connected to said charge storage means during said second period and further for energizing said precharging means whenever said output signal continues to occur after said first and second switch means change state; and means connected to said automatic polarity control means for providing a polarity output signal which changes state whenever said reversing the connections of said first and second input terminals occurs thereby providing an indication of the polarity of said analog input voltage.

* * * * *